(12) United States Patent
Takeya et al.

(10) Patent No.: US 12,537,517 B2
(45) Date of Patent: Jan. 27, 2026

(54) PHASE ADJUSTMENT CIRCUIT

(71) Applicant: NTT, Inc., Tokyo (JP)

(72) Inventors: Tsutomu Takeya, Tokyo (JP);
Munehiko Nagatani, Tokyo (JP);
Teruo Jo, Tokyo (JP); Hitoshi Wakita, Tokyo (JP); Hiroyuki Takahashi, Tokyo (JP)

(73) Assignee: NTT, Inc., Tokyo (JP)

( * ) Notice: Subject to any disclaimer, the term of this patent is extended or adjusted under 35 U.S.C. 154(b) by 3 days.

(21) Appl. No.: 18/717,811

(22) PCT Filed: Dec. 16, 2021

(86) PCT No.: PCT/JP2021/046503
§ 371 (c)(1),
(2) Date: Jun. 7, 2024

(87) PCT Pub. No.: WO2023/112249
PCT Pub. Date: Jun. 22, 2023

(65) Prior Publication Data
US 2025/0119127 A1   Apr. 10, 2025

(51) Int. Cl.
*H03K 5/01* (2006.01)
*H03K 17/56* (2006.01)
*H03K 5/00* (2006.01)

(52) U.S. Cl.
CPC ............... *H03K 5/01* (2013.01); *H03K 17/56* (2013.01); *H03K 2005/00286* (2013.01)

(58) Field of Classification Search
CPC .................... H03K 5/01; H03K 17/56; H03K 2005/00286; H03H 11/20

(Continued)

(56) References Cited

U.S. PATENT DOCUMENTS

| 11,056,935 B2* | 7/2021 | Ikenaga ............... H02P 6/16 |
| 2009/0086850 A1* | 4/2009 | Rofougaran ........... H03D 3/009 |
| | | 375/322 |

(Continued)

OTHER PUBLICATIONS

Goyal et al., "A High-Resolution Digital Phase Interpolator based CDR with a Half-Rate Hybrid Phase Detector," 2019 IEEE International Symposium on Circuits and Systems (ISCAS), May 1, 2019, Total pp. 05.

*Primary Examiner* — Ryan Jager
(74) *Attorney, Agent, or Firm* — Slater Matsil, LLP

(57) ABSTRACT

In some embodiments, the phase adjustment circuit includes a clock generator that is configured to generate a sinusoidal clock signal, and may include a variable amplifier that is configured to receive the clock signal output from the clock generator as an input, output an amplitude-adjusted sinusoidal differential clock signal, and output an amplitude-adjusted in-phase signal. The phase adjustment circuit may include an adder that is configured to output a differential signal obtained by adding the in-phase signal to each of a positive phase side and a negative phase side of the differential clock signal output from the variable amplifier, a differential transmission line that includes two transmission lines configured to transmit the differential signal output from the adder, and a terminal circuit that is configured to terminate the differential transmission line where a signal is output from a terminal of any one of the two transmission lines.

20 Claims, 11 Drawing Sheets

(58) Field of Classification Search
USPC .......................................................... 315/294
See application file for complete search history.

(56) References Cited

U.S. PATENT DOCUMENTS

| | | | |
|---|---|---|---|
| 2010/0128182 A1* | 5/2010 | Ichimura | H04N 21/43635 |
| | | | 348/E5.093 |
| 2013/0058437 A1* | 3/2013 | Oshima | H03M 1/0836 |
| | | | 341/166 |
| 2013/0142283 A1* | 6/2013 | Hori | H03F 3/245 |
| | | | 375/300 |
| 2020/0204189 A1* | 6/2020 | Watanabe | H03M 1/60 |
| 2022/0163605 A1* | 5/2022 | Timopheev | G01R 33/0029 |
| 2023/0134728 A1* | 5/2023 | Zucker | G01R 33/06 |
| | | | 324/207.2 |
| 2024/0094421 A1* | 3/2024 | Muijzert | G01V 1/303 |
| 2025/0119127 A1* | 4/2025 | Takeya | H03H 11/20 |

* cited by examiner

PHASE ADJUSTMENT CIRCUIT

CROSS-REFERENCE TO RELATED APPLICATIONS

This application is a national phase entry of PCT Application No. PCT/JP2021/046503, filed on Dec. 16, 2021, which application is hereby incorporated herein by reference.

TECHNICAL FIELD

The present invention relates to a phase adjustment circuit of a sine wave.

BACKGROUND

At present, the sine wave plays an important role. In communication, the sine wave may be used for generating a carrier wave, or the sine wave may be used as a clock. In the communication, not only is a clock used as the carrier wave but also a timing reference for determining data.

When the clock is used as the timing reference for such data determination, it is necessary to adjust the phase of the clock and perform data determination at an appropriate timing. As a method for performing the data determination at an appropriate timing, there is clock data recovery. As means for realizing the clock data recovery, a configuration using a phase comparator and a phase adjustment circuit is known. In this configuration, phases are compared by some means, and a desired phase is generated on the basis of the comparison result.

Conventionally, as the phase adjustment circuit, a structure disclosed in NPL 1 is known. A configuration of the phase adjustment circuit of the related art is shown in FIG. 9. In the configuration shown in FIG. 9, a waveform of an arbitrary intermediate phase is generated by adding a reference sine wave sin ωt and a sine wave cos ωt having a fixed phase difference of $\pi/2$ with respect to the sine wave sin ωt. The sine waves sin ωt and cos ωt are multiplied by constants A and B by multipliers 101 and 102, respectively. The following equation is established from equation of trigonometric function synthesis.

[Math. 1]

$$A\sin\omega t + B\cos\omega t = \sqrt{A^2 + B^2} \sin(\omega t + \alpha) \quad (1)$$

α in equation (1) is as follows:

[Math. 2]

$$\cos\alpha = \frac{A}{\sqrt{A^2 + B^2}}, \sin\alpha = \frac{B}{\sqrt{A^2 + B^2}} \quad (2)$$

In the configuration of FIG. 9, sine waves sin ωt and cos ωt are generated, using a Quadrature-VCO (Voltage Controlled Oscillator) 100. However, since the Quadrature-VCO 100 has a lower oscillation frequency in terms of structure, there is a problem that it is difficult to use in a limit region of a device. In addition, although a method of using a 90 degree hybrid is known as a method of producing a sine wave having a fixed phase difference of $\pi/2$ from the sine wave, there is a problem that it operates only at a specific frequency when using the 90 degree hybrid.

CITATION LIST

Non Patent Literature

[NPL 1] Arun Goyal, et al., "A High-Resolution Digital Phase Interpolator Based CDR with a Half-Rate Hybrid Phase Detector", 2019 IEEE International Symposium on Circuits and Systems (ISCAS), May 2019

SUMMARY

Technical Problem

The present invention is accomplished to solve above problem, and an object thereof is to provide a phase adjustment circuit that is available in a wide range of frequencies.

Solution to Problem

A phase adjustment circuit of embodiments of the present invention includes a clock generation unit configured to generate a sinusoidal clock signal; a variable amplifier configured to receive a clock signal output from the clock generation unit as an input, output an amplitude-adjusted sinusoidal differential clock signal, and output an amplitude-adjusted in-phase signal; an adding unit configured to output a differential signal obtained by adding the in-phase signal to each of a positive phase side and a negative phase side of the differential clock signal output from the variable amplifier; a differential transmission line configured to transmit the differential signal output from the adding unit; and a terminal circuit configured to terminate the differential transmission line, in which a signal is output from a terminal of any one of two transmission lines constituting the differential transmission line.

In one configuration example of the phase adjustment circuit of the present invention, the terminal circuit includes: a first resistor one end of which is connected to a terminal of a first transmission line of the two transmission lines, a second resistor one end of which is connected to a terminal of a second transmission line of the two transmission lines, and a third resistor one end of which is connected to a connection point of the first and second resistors and the other end is connected to a fixed potential or ground.

In one configuration example of the phase adjustment circuit of the present invention, the adding unit includes a first transistor in which a clock signal on the negative phase side of the differential clock signal output from the variable amplifier is input to a base or a gate, and a signal on the positive phase side of the differential signal is output from a collector or a drain; a second transistor in which a clock signal on the positive phase side of the differential clock signal output from the variable amplifier is input to a base, and a signal on the negative phase side of the differential signal is output from the collector or the drain; a third transistor in which an in-phase signal output from the variable amplifier is input to the base or the gate; a fourth resistor one end of which is connected to a power supply voltage; a fifth resistor one end of which is connected to the other end of the fourth resistor and the other end is connected to the collector or the drain of the first transistor; a sixth resistor one end of which is connected to the other end of the fourth resistor and the other end is connected to the collector or the drain of the second transistor; a seventh resistor one end of which is connected to an emitter or a source of the first transistor and the other end is connected to a collector or a drain of the third transistor; an eighth resistor one end of which is connected to an emitter or a source of the second transistor and the other end is connected to the collector or the drain of the third transistor; a ninth resistor one end of which is connected to the power supply voltage and the other end is connected to a base or a gate of the third transistor; a tenth resistor one end of which is connected to the base or the gate of the third transistor and the other end is connected to the ground; and an eleventh resistor one end of which is connected to an emitter or a source of the third transistor and the other end is connected to the ground.

In one configuration example of the phase adjustment circuit, the variable amplifier includes a first variable amplifier of a Gilbert cell type which adjusts an amplitude of the differential clock signal and outputs the differential clock signal, and a second variable amplifier of a Gilbert cell type which adjusts an amplitude of the in-phase signal and outputs the in-phase signal.

Further, in one configuration example of the phase adjustment circuit of the present invention, the first variable amplifier includes a fourth transistor in which a first gain control signal is input to a base or a gate, and the signal on the positive phase side of the differential clock signal is output from a collector or a drain; a fifth transistor in which a second gain control signal is input to a base or a gate, and the signal on the negative phase side of the differential clock signal is output from a collector or a drain; a sixth transistor in which the first gain control signal is input to a base or a gate, and the signal on the negative phase side of the differential clock signal is output from a collector or a drain; a seventh transistor in which the second gain control signal is input to a base or a gate, and the signal on the positive phase side of the differential clock signal is output from a collector or a drain; an eighth transistor in which the signal on the positive phase side of the differential clock signal output from outside is input to a base or a gate, and a collector or a drain is connected to an emitter or a source of the fourth and fifth transistors; a ninth transistor in which the signal on the negative phase side of the differential clock signal output from outside is input to a base or a gate, and a collector or a drain is connected to an emitter or a source of the sixth and seventh transistors; a tenth transistor in which a bias voltage is applied to a base or a gate; a twelfth resistor one end of which is connected to the power supply voltage, and the other end is connected to a collector or a drain of the fourth and seventh transistors; a thirteenth resistor one end of which is connected to the power supply voltage, and the other end is connected to a collector or a drain of the fifth and sixth transistors; a fourteenth resistor one end of which is connected to an emitter or a source of the eighth transistor, and the other end is connected to the collector or the drain of the tenth transistor; a fifteenth resistor one end of which is connected to an emitter or a source of the ninth transistor, and the other end is connected to the collector or the drain of the tenth transistor; and a sixteenth resistor one end of which is connected to an emitter or a source of the tenth transistor, and the other end is connected to the ground. The second variable amplifier includes an eleventh transistor in which a third gain control signal is input to a base or a gate, and an in-phase signal is output from a collector or a drain; a twelfth transistor in which a fourth gain control signal is input to a base or a gate; a thirteenth transistor in which the third gain control signal is input to a base or a gate; a fourteenth transistor in which the fourth gain control signal is input to a base or a gate, and the in-phase signal is output from a collector or a drain; a fifteenth transistor in which a signal on the positive phase side of the differential clock signal output from outside is input to a base or a gate, and a collector or a drain is connected to an emitter or a source of the eleventh and twelfth transistors; a sixteenth transistor in which a signal on the negative phase side of the differential clock signal output from outside is input to a base or a gate, and a collector or a drain is connected to an emitter or a source of the thirteenth and fourteenth transistors; a seventeenth transistor in which a bias voltage is given to a base or a gate; a seventeenth resistor one end of which is connected to the power supply voltage, and the other end is connected to the collector or the drain of the eleventh and fourteenth transistors; an eighteenth resistor one end of which is connected to the power supply voltage, and the other end is connected to a collector or a drain of the twelfth and thirteenth transistors; a nineteenth resistor one end of which is connected to an emitter or a source of the fifteenth transistor, and the other end is connected to a collector or a drain of the seventeenth transistor; a twentieth resistor one end of which is connected to an emitter or a source of the sixteenth transistor, and the other end is connected to the collector or the drain of the seventeenth transistor; and a twenty-first resistor one end of which is connected to an emitter or a source of the seventeenth transistor, and the other end is connected to the ground.

In one example of the configuration of the phase adjustment circuit of the present invention, the two transmission lines constituting the differential transmission line are disposed so that respective signal lines are adjacent to each other.

In one configuration example of the phase adjustment circuit of the present invention, when a propagation speed for a differential mode of the differential transmission line is defined as vd, a propagation speed for a common mode of the differential transmission line is defined as vc, and a maximum angular frequency of a sinusoidal clock signal to be phase-adjusted is defined as $\omega$, a length L of each of the two transmission lines constituting the differential transmission line is set to satisfy $L<\pi/\{\omega|(1/Vd)-(1/Vc)|\}$.

One configuration example of the phase adjustment circuit of the present invention further includes a level adjusting unit configured to perform an amplitude adjustment of a signal output from one terminal of two transmission lines constituting the differential transmission line.

Advantageous Effects of Embodiments of the Invention

According to embodiments of the present invention, by providing the clock generation unit, the variable amplifier, the adding unit, the differential transmission line, and the terminal circuit, and by outputting a signal from one of the two transmission lines constituting the differential transmission line, it is not necessary to use a conventional Quadrature-VCO as a clock generation unit, and an LC-VCO made up of a general LC oscillator can be used as the clock generation unit. In addition, the present invention can be used in a wide range of frequencies, unlike a configuration in which a 90-degree hybrid is used as the clock generation unit.

DETAILED DESCRIPTION OF ILLUSTRATIVE EMBODIMENTS

First Example

Figure 1:
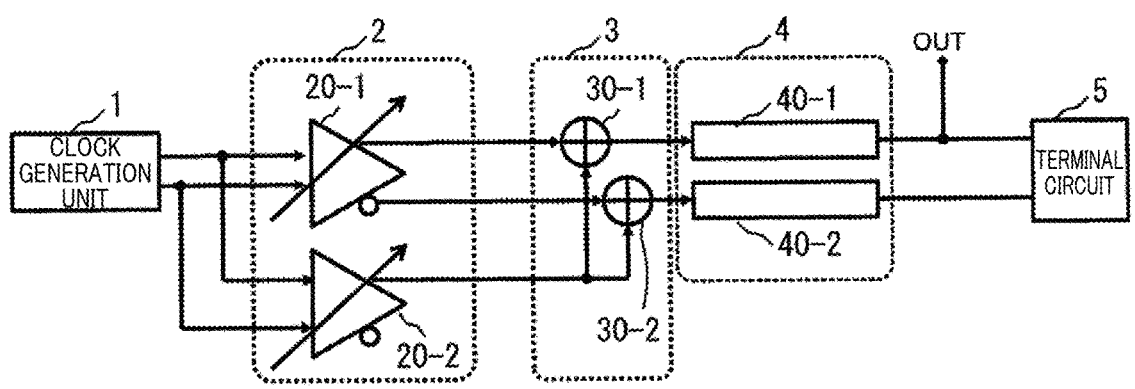
FIG. 1 is a block diagram showing a configuration of a phase adjustment circuit according to a first example of the present invention.

Referring to the drawings, a description will be given of examples of the present invention. FIG. 1 is a block diagram showing a configuration of a phase adjustment circuit according to a first example of the present invention. The phase adjustment circuit includes a clock generation unit 1 which generates a sinusoidal differential clock signal; a variable amplifier 2 which receives a differential clock signal output from the clock generation unit 1 as an input, outputs an amplitude-adjusted differential clock signal, and simultaneously outputs an amplitude-adjusted in-phase signal; an adding unit 3 which outputs a differential signal obtained by adding the in-phase signal to each of a positive phase side and a negative phase side of the differential clock signal output from the variable amplifier 2; a differential transmission line 4 which transmits the differential signal output from the adding unit 3, and a terminal circuit 5 which terminates the differential transmission line 4.

The amplitude of the differential clock signal and the in-phase signal is adjusted by variable amplifiers 20-1 and 20-2 prepared respectively. Although the details are omitted in FIG. 1, the input forms of the variable amplifiers 20-1 and 20-2 may be in-phase and differential. That is, the output of the clock generation unit 1 may be a single-phase clock signal.

The adding unit 3 is made up of an adding unit 30-1 which adds and outputs the positive phase side and the in-phase signal of the differential clock signal, and an adding unit 30-2 which adds and outputs the negative phase side and the in-phase signal of the differential clock signal. The adding units 30-1 and 30-2 may be designed depending on the characteristic impedance of the differential transmission line 4.

The differential transmission line 4 means a transmission line in which a transmission line 40-1 on the positive phase side and a transmission line 40-2 on the negative phase side are electromagnetically coupled. The differential transmission line 4 of this example has different propagation speeds of the in-phase signal and the differential signal. A terminal circuit 5 is connected to the terminal of the differential transmission line 4. In this example, a sine wave of an intermediate phase can be extracted from the terminal of the transmission line 40-1 on the positive phase side. As will be described later, a sine wave may be taken out from the terminal of the transmission line 40-2 on the negative phase side.

It is known that a propagation speed difference occurs between the differential signal and the in-phase signal in the differential transmission line 4. The propagation speed for the differential mode is defined as $v_d$, and the propagation speed for the common mode is defined as $v_c$. When a length of the transmission lines 40-1 and 40-2 is defined as L and an angular frequency of the sine wave is defined as ω, if the propagation delay is converted into a phase, the phase of the sine wave in the differential mode becomes $(L/v_d)\omega$, and the phase of the sine wave in the common mode becomes $(L/v_c)\omega$.

When the differential signal at the output terminal of the adding unit 3 is defined as α sin ωt and the in-phase signal is defined as β sin (ωT+δ), the differential signal at the terminal of the differential transmission line 4 is α sin (ωT+(ω/$v_d$)), and the in-phase signal at the terminal of the differential transmission line 4 is β sin (ωT+(ωL/$v_c$)+δ). Here, δ indicates a phase delay or a phase advance assuming a case where a delay is given to the in-phase signal and the differential signal due to a manufacturing error or some influence.

In this example, since an output signal OUT is taken out from one of the transmission lines 40-1 and 40-2 constituting the differential transmission line 4, the output signal OUT is expressed by the following equation.

[Math. 3]

$$\text{OUT} = \pm\frac{\alpha}{2}\sin\left(\omega T + \frac{\omega L}{v_d}\right) + \beta\sin\left(\omega T + \frac{\omega L}{v_c} + \delta\right) \qquad (3)$$

When the output signal OUT is taken out from the terminal of the transmission line 40-1, a first term on a right side of equation (3) is +(α/2) sin (ωT+(ωL/vd)), and when the output signal OUT is taken out from the transmission line 40-2, the first term on the right side is −(α/2) sin (ωT+(ωL/vd)).

Here, when a=±α/2, B=β, ωt=ωT+(ωL/vd), φ=(ωL/vc)+δ are newly defined, the output signal OUT is represented by the following equation.

[Math. 4]

$$\text{OUT} = A\sin\omega t + B\sin(\omega t + \varphi) \qquad (4)$$

Since ωT is only the one obtained by translating ωt, the explanation by equation (4) and the explanation by equation (3) are the same as each other that the intermediate phase can be generated in the configuration of this example. By rearranging equation (4), the following equation (5) is obtained.

[Math. 5]

$$\text{OUT} = A\sin\omega t + B\sin(\omega t + \varphi) = \qquad (5)$$
$$\text{Im}\left[Ae^{j\omega t} + Be^{j(\omega t+\varphi)}\right] = \text{Im}\left[(A + Be^{j\varphi})e^{j\omega t}\right] = \text{Im}\left[re^{j\rho}e^{j\omega t}\right]$$

In equation (5), ejωt represents a reference sin wave. It can be seen from equation (5) that the sin wave having the phase different by p from the reference phase can be generated, by adding the sin wave having the reference frequency and the sin wave having an arbitrary phase different by cp.

A detailed description will be given below. Since the amount of change in the output phase may be calculated by calculating rejρ, when rearranging equation (5), the following equation is obtained.

[Math. 6]

$$re^{j\rho} = A + Be^{j\varphi} = A + B\cos(\varphi) + jB\sin(\varphi) = \qquad (6)$$
$$B\left[\frac{A}{B} + \cos(\varphi) + j\sin(\varphi)\right] = B[x + \cos(\varphi) + j\sin(\varphi)]$$

From Equation (6), the phase angle ρ is given by Equation (7).

[Math. 7]

$$\rho = \arg(B[x + \cos(\varphi) + j\sin(\varphi)]) = \arg(x + \cos(\varphi) + j\sin(\varphi)) \qquad (7)$$

A value range when the phase angle ρ is controlled by the amplitudes A and B is considered. Although the range of the output amplitudes A and B on the circuit is finite with 0 as the center, since A and B are independent, x=A/B∈[−∞, +∞], and an arbitrary real number can be selected as the amplitudes A and B. The sign of x can be determined by the combination of the signs of the amplitudes A and B, and the denominator B can be reduced as much as possible to increase the value of x.

Further, when y=x+cos (φ), y=(A/B)+cos (φ)∈ [−∞, +∞] is clearly expressed. Therefore, ρ=arg (x+cos (φ)+j sin (φ))=arg (y+j sin (φ)) can take a value of 0 to π[rad] under conditions of sin (φ)≠0. It is also clear that ρ=arg (x+cos (φ)+j sin (φ))=arg (y+j sin (φ)) can take −π to 0 [rad], assuming that the polarity of B is reversed. That is, according to this example, a signal in which an input sine wave is adjusted to an arbitrary phase can be output.

Figure 2:
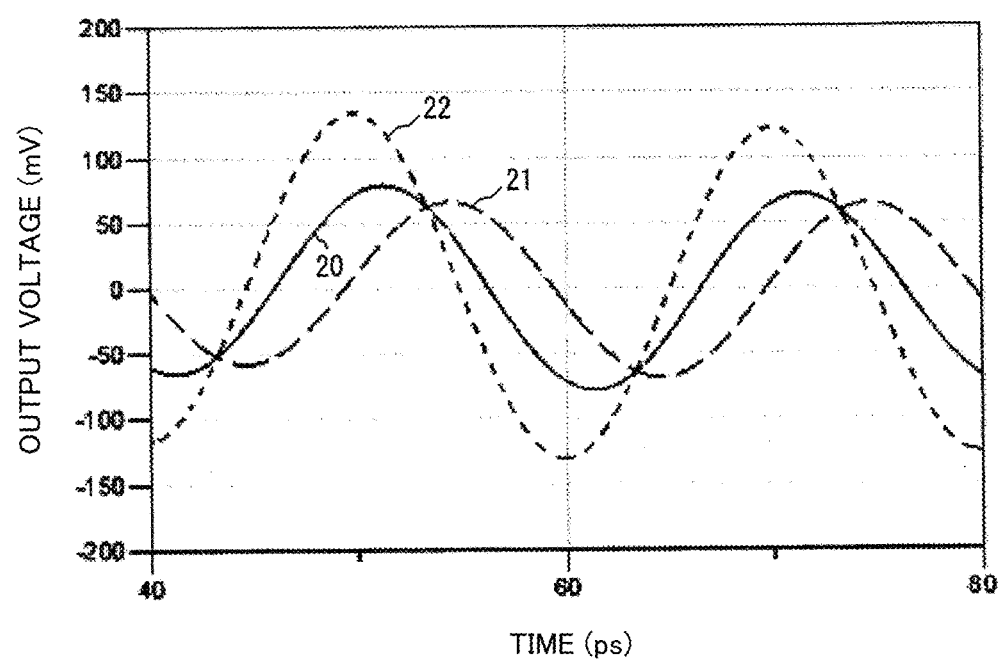
FIG. 2 is a diagram showing simulation results of the phase adjustment circuit according to the first example of the present invention.

FIG. 2 shows a result of confirmation by circuit simulation that the phase of the sine wave changes by the phase adjustment circuit of this example. Here, sine waves 21 and 22 are shown in which the values of amplitudes A and B in equations (4) to (7) are changed and the phase is changed by approximately 4 ps, by setting the frequency of the sine wave 20 input from the clock generation unit 1 to 50 GHz (period 20 ps), and changing the control voltages (gains) of the variable amplifiers 20-1 and 20-2. In the example shown in FIG. 2, adjustment for equalizing the amplitudes of the sine waves 20 to 22 is not performed to make the phase change easy to understand.

In this example, although it is necessary to generate a difference in propagation speed between the in-phase signal and the differential signal, the type and structure of the transmission lines 40-1 and 40-2 are not limited. That is, coplanar lines or microstrip lines may be used as the transmission lines 40-1 and 40-2.

When the length L of the transmission lines 40-1 and 40-2 satisfies (L/vd)ω−(L/vc) ω=πn (n is an arbitrary integer), the phase adjustment cannot be realized because there is no phase difference between sin ωt and sin (ωt+φ). That is, when φ=π, the sign of B is only changed without the phase difference only by −sin.

Therefore, the phase adjustment circuit of this example is designed to satisfy equation (8) at the maximum assumed frequency of the sine wave signal to be subjected to phase adjustment.

[Math. 8]

$$\left|\frac{L}{v_d}\omega - \frac{L}{v_c}\omega\right| < \pi \Rightarrow L < \frac{\pi}{\omega\left|\frac{1}{v_d} - \frac{1}{v_c}\right|} \qquad (8)$$

By designing to satisfy equation (8), it is possible to design so that a phase difference is always generated between sin ωt and sin (ωt+<φ) in the frequency range to be used. In the case where equation (8) is satisfied, because the length of the transmission line can be minimized, the circuit area and the cost can be reduced.

Second Example

Figure 3:
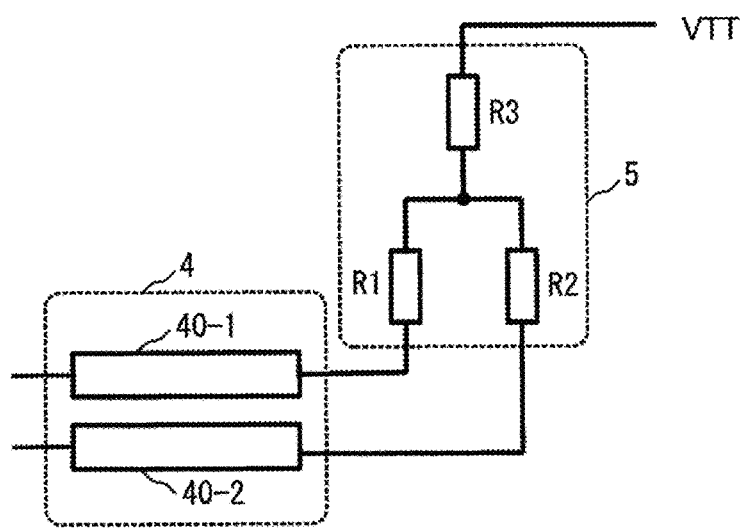
FIG. 3 is a circuit diagram showing the configuration of a terminal circuit according to a second example of the present invention.

Next, a description will be given of a second example of the present invention. This example shows a specific example of the terminal circuit 5 of the first example. As shown in FIG. 3, the terminal circuit 5 includes a resistor R1 one end of which is connected to the terminal of the transmission line 40-1, a resistor R2 one end of which is connected to the terminal of the transmission line 40-2, and a resistor R3 one end of which is connected to a connection point of the resistors R1 and R2 and the other end is connected to a fixed potential VTT.

In the first example, since both the in-phase signal and the differential signal are transmitted by using the differential transmission line 4, impedance setting for each signal is required. According to the T-type terminal circuit 5 shown in FIG. 3, impedance can be set for each signal mode.

Although the resistor R3 of the terminal circuit 5 may be connected to the ground, the resistor R3 may be connected to the fixed potential VTT other than the ground, as shown in FIG. 3, due to the convenience of the bias point of the adding unit 3.

Third Example

Figure 4:
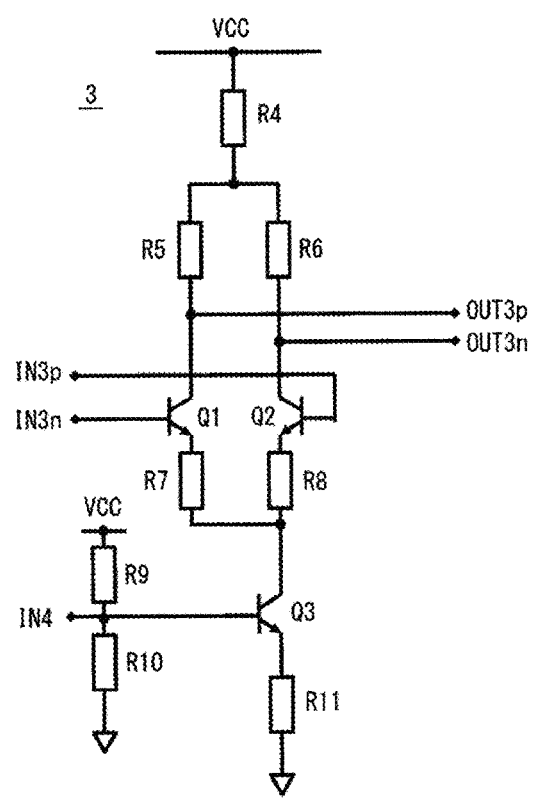
FIG. 4 is a circuit diagram showing a configuration of an adding unit according to a third example of the present invention.

Next, a description will be given of a third example of the present invention. This example shows a specific example of the adding unit 3 and the variable amplifier 2 of the first example. As shown in FIG. 4, the adding unit 3 includes an NPN bipolar transistor Q1 in which a signal IN3n on the negative phase side of the differential clock signal output from the variable amplifier 2 is input to a base and a signal OUT3p on the positive phase side of the differential signal is output from a collector; an NPN bipolar transistor Q2 in which a signal IN3p on the positive phase side of the differential clock signal output from the variable amplifier 2 is input to a base, and a signal OUT3n on the negative phase side of the differential signal is output from the collector; an NPN bipolar transistor Q3 in which an in-phase signal IN4 output from the variable amplifier 2 is input to a base; a resistor R4 one end of which is connected to a power supply voltage VCC; a resistor R5 one end of which is connected to the other end of the resistor R4 and the other end is connected to the collector of the transistor Q1; a resistor R6 one end of which is connected to the other end of the resistor R4 and the other end is connected to the collector of the transistor Q2; a resistor R7 one end of which is connected to an emitter of the transistor Q1 and the other end is connected to the collector of the transistor Q3; a resistor R8 one end of which is connected to the emitter of transistor Q2 and the other end is connected to the collector of transistor Q3; a resistor R9 one end of which is connected to the power supply voltage VCC and the other end is connected to the base of the transistor Q3; a resistor R10 one end of which is connected to the base of the transistor Q3 and the other end is connected to the ground; and a resistor R11 one end of which is connected to the emitter of the transistor Q3 and the other end is connected to the ground.

The transistor Q3 is a tail current source which supplies current to the transistors Q1 and Q2, and an appropriate bias voltage is required. In the example shown in FIG. 4, the bias voltage of the tail current source is generated by a resistor voltage divider circuit including the resistors R9 and R10.

Figure 5:
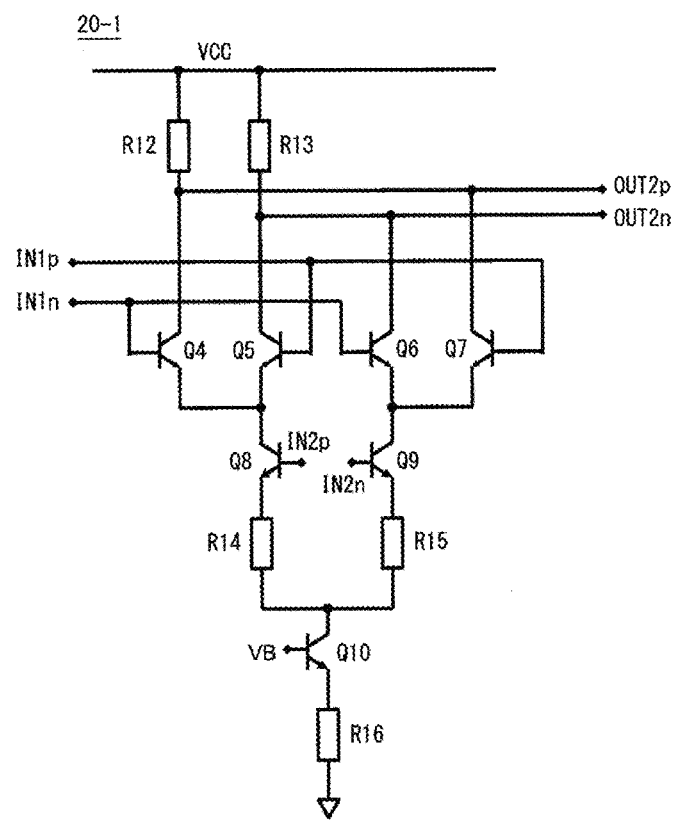
FIG. 5 is a circuit diagram showing the configuration of a variable amplifier according to the third example of the present invention.

A Gilbert cell can be used as the variable amplifiers 20-1 and 20-2. As shown in FIG. 5, the variable amplifier 20-1 includes an NPN bipolar transistor Q4 in which a gain control signal IN1$n$ is input to a base and a signal OUT2$p$ on the positive phase side of the differential clock signal is output from a collector; an NPN bipolar transistor Q5 in which a gain control signal IN1$p$ is input to a base and a signal OUT2$n$ on the negative phase side of the differential clock signal is output from a collector; an NPN bipolar transistor Q6 in which the gain control signal IN1$n$ is input to a base and the signal OUT2$n$ on the negative phase side of the differential clock signal is output from a collector; an NPN bipolar transistor Q7 in which the gain control signal IN1$p$ is input to a base and the signal OUT2$p$ on the positive phase side of the differential clock signal is output from a collector; an NPN bipolar transistor Q8 in which a signal IN2$p$ on the positive phase side of the differential clock signal output from the clock generation unit 1 is input to a base, and a collector is connected to the emitters of the transistors Q4 and Q5; an NPN bipolar transistor Q9 in which a signal IN2$n$ on the negative phase side of the differential clock signal output from the clock generation unit 1 is input to a base, and a collector is connected to the emitters of the transistors Q6 and Q7; an NPN bipolar transistor Q10 in which a bias voltage VB is applied to a base; a resistor R12 one end of which is connected to the power supply voltage VCC and the other end is connected to the collectors of the transistors Q4 and Q7; a resistor R13 one end of which is connected to the power supply voltage VCC and the other end is connected to the collectors of the transistors Q5 and Q6; a resistor R14 one end of which is connected to the emitter of the transistor Q8 and the other end is connected to the collector of the transistor Q10; a resistor R15 one end of which is connected to the emitter of the transistor Q9 and the other end is connected to the collector of the transistor Q10; and a resistor R16 one end of which is connected to the emitter of the transistor Q10 and the other end is connected to the ground.

The gain of the variable amplifier 20-1 can be controlled by the voltage difference between the gain control signals IN1$p$ and IN1$n$.

Figure 6:
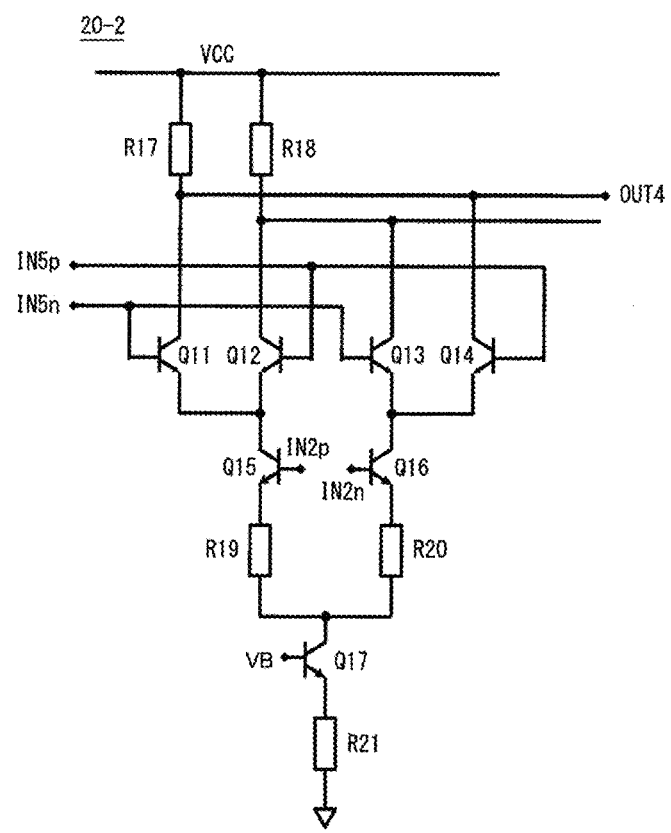
FIG. 6 is a circuit diagram showing the configuration of a variable amplifier according to the third example of the present invention.

As shown in FIG. 6, the variable amplifier 20-2 includes an NPN bipolar transistor Q11 in which a gain control signal IN5$n$ is input to a base and an in-phase signal OUT4 is output from a collector; an NPN bipolar transistor Q12 in which a gain control signal IN5$p$ is input to a base; an NPN bipolar transistor Q13 in which the gain control signal IN5$n$ is input to a base; an NPN bipolar transistor Q14 in which the gain control signal IN5$p$ is input to a base and the in-phase signal OUT4 is output from a collector; an NPN bipolar transistor Q15 in which a signal IN2$p$ on the positive phase side of the differential clock signal output from the clock generation unit 1 is input to a base and a collector is connected to the emitters of the transistors Q11 and Q12; an NPN bipolar transistor Q16 in which a signal IN2$n$ on the negative phase side of the differential clock signal output from the clock generation unit 1 is input to a base and a collector is connected to the emitters of the transistors Q13 and Q14; an NPN bipolar transistor Q17 in which a bias voltage VB is given to the base; a resistor R17 one end of which is connected to the power supply voltage VCC and the other end is connected to the collectors of the transistors Q11 and Q14; a resistor R18 one end of which is connected to the power supply voltage VCC and the other end is connected to the collectors of the transistors Q12 and Q13; a resistor R19 one end of which is connected to the emitter of the transistor Q15 and the other end is connected to the collector of the transistor Q17; a resistor R20 one end of which is connected to the emitter of the transistor Q16 and the other end is connected to the collector of the transistor Q17; and a resistor R21 one end of which is connected to the emitter of the transistor Q17 and the other end is connected to the ground.

The gain of the variable amplifier 20-1 can be controlled by the voltage difference between the gain control signals IN5$p$ and IN5$n$. As shown in FIG. 6, in the case of a single-phase output variable amplifier 20-2, an in-phase signal OUT4 is output instead of the signal OUT2$p$ on the positive phase side of the differential clock signal of FIG. 5, and an output terminal of the signal OUT2$n$ on the negative phase side is opened or a dummy load may be connected.

Although an example in which a bipolar transistor is used as the transistors Q1 to Q17 is shown in FIGS. 4 to 6, a MOS transistor may be used. When the MOS transistor is used, in the above description, it is essential only that the gate is replaced with the base, the drain may be replaced with the collector, and the source may be replaced with the emitter.

Further, a resistor or a capacitor for gain adjustment and frequency response adjustment may be inserted into the emitter or the source of the transistor, or both of the resistor and the capacitor may be inserted into the emitter or the source of the transistor. In addition, an arbitrary amplifier circuit such as an emitter follower may be provided as necessary for level adjustment or the like.

Fourth Example

Next, a fourth example of the present invention will be described. This example shows a specific example of the differential transmission line 4 of the first example. As described above, the differential transmission line 4 must have a structure in which a propagation speed difference occurs between the differential mode and the common mode. In order to generate the propagation speed difference between the differential mode and the common mode, it is more efficient to couple electromagnetic fields between the differential ports.

Therefore, the differential transmission line 4 used in the present invention may have a configuration in which the transmission lines 40-1 and 40-2 are adjacent to each other to be electromagnetically coupled without putting a ground plane between the transmission lines 40-1 and 40-2.

Figure 7A:
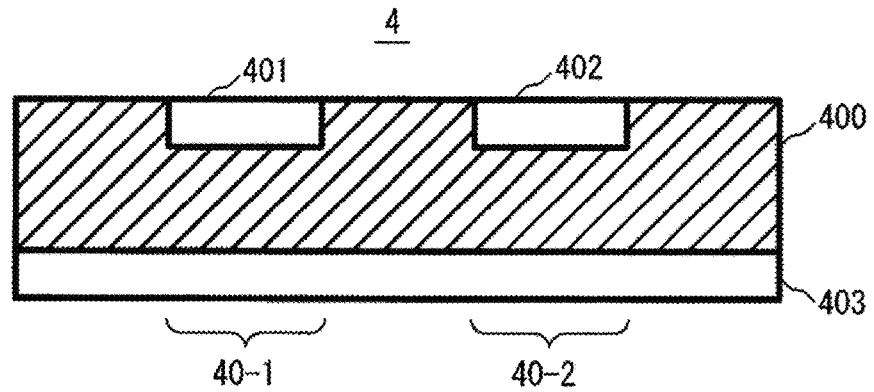
FIGS. 7A to 7C are cross-sectional views showing a configuration of a differential transmission line according to a fourth example of the present invention.
Figure 7B:
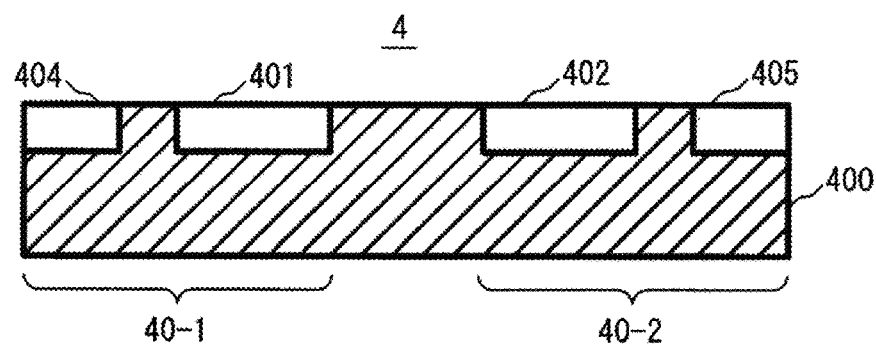
Figure 7C:
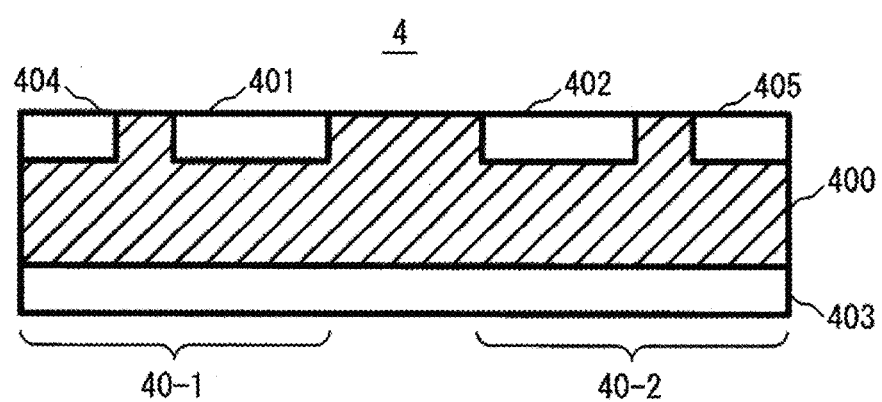

Cross-sectional views of the differential transmission line 4 are shown in FIGS. 7A to 7C. An example of FIG. 7A shows an example of a microstrip line. A transmission line 40-1 includes a dielectric 400, a signal line 401 made of a conductor formed on the front of the dielectric 400, and a ground plane 403 made of a conductor formed on a back of the dielectric 400. A transmission line 40-2 includes a dielectric 400, a signal line 402 made of a conductor formed on the front of the dielectric 400, and a ground plane 403.

The example of FIG. 7B shows an example of a coplanar line. The transmission line 40-1 includes a dielectric 400, a signal line 401, and a ground plane 404 made of a conductor formed on the front of the dielectric 400 on the opposite side to the signal line 402 across the signal line 401. The transmission line 40-2 includes a dielectric 400, a signal line 402, and a ground plane 405 made of a conductor formed on the front of the dielectric 400 on the opposite side to the signal line 401 across the signal line 402.

An example of FIG. 7C shows an example of a coplanar line with a back ground in which the structure of FIG. 7A and the structure of FIG. 7B are combined. The transmission line 40-1 is made up of a dielectric 400, a signal line 401, and ground planes 403 and 404. The transmission line 40-2 is made up of a dielectric 400, a signal line 402, and ground planes 403 and 405.

In the example of FIGS. 7A to 7C, although the signal lines 401 and 402 are laid out side by side, a structure in which the signal lines 401 and 402 are stacked vertically to strengthen the coupling between the signal lines 401 and 402 may be used.

The ground planes 403 to 405 in FIGS. 7A to 7C may not be provided. However, in the present invention, since it is necessary to transmit the in-phase signal together, the impedance design is facilitated by providing at least one ground plane on the side or the upper and lower sides of the signal lines 401 and 402.

Fifth Example

Figure 8:
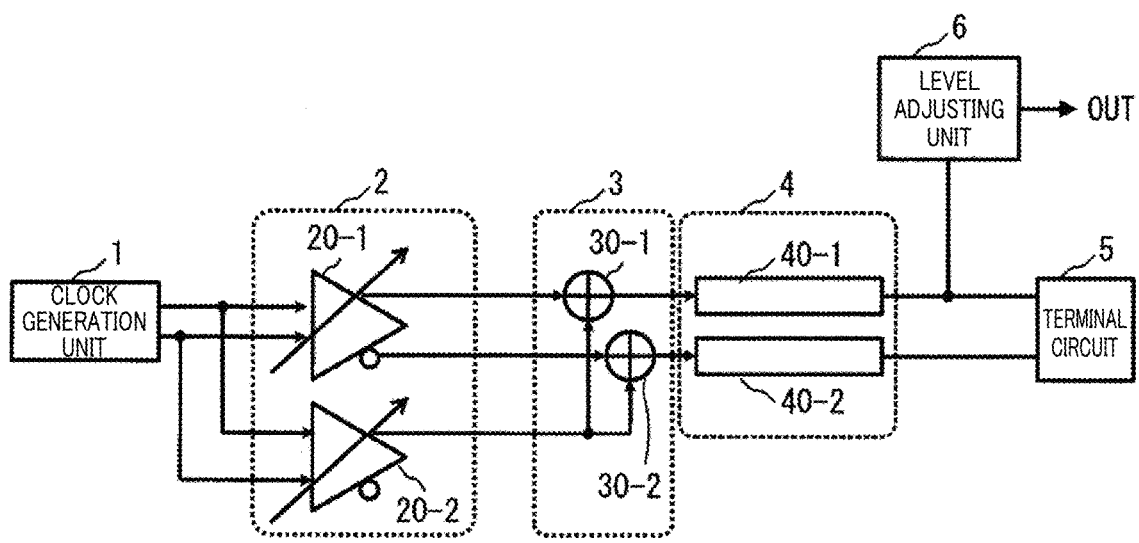
FIG. 8 is a block diagram showing a configuration of a phase adjustment circuit according to a fifth example of the present invention.
Figure 9:
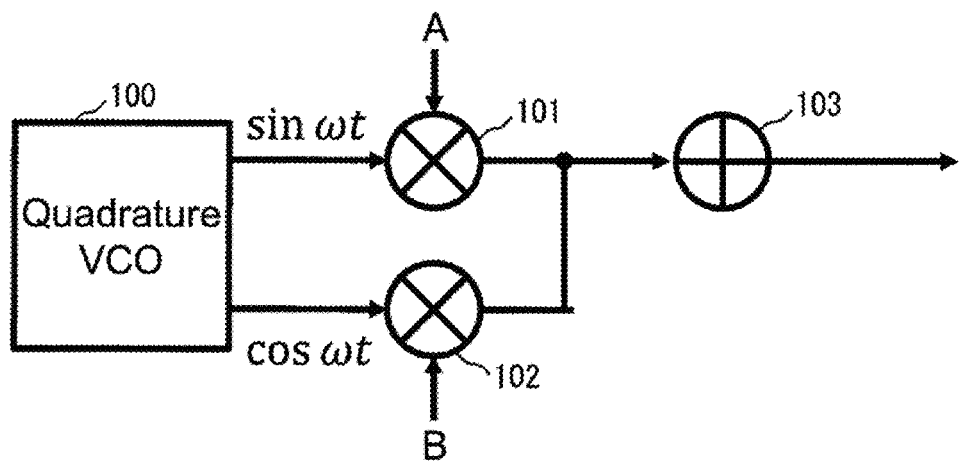
FIG. 9 is a block diagram showing a configuration of a phase adjustment circuit of the related art.

Next, a fifth example of the present invention will be described. FIG. 8 is a diagram showing a configuration of a phase adjustment circuit according to the fifth example of the present invention. The phase adjustment circuit of this example is obtained by adding a level adjusting unit 6 to the output terminal of the phase adjustment circuit of the first example.

The output amplitude of the phase adjustment circuit according to the present invention changes in principle in accordance with the adjusted phase. For this reason, the level adjusting unit 6 may be provided to correspond to the varying output amplitude. As the level adjusting unit 6, there is a variable gain amplifier (VGA) capable of adjusting the output amplitude or an automatic gain control (AGC) circuit for automatically adjusting the output amplitude. The configuration of the VGA and the AGC circuit is not limited. When the AGC circuit is used, a peak detector or a power detector is connected to the output terminal (the terminal of the transmission line 40-1 or 40-2) of the phase adjustment circuit, and the detection result is fed back to the amplifier to adjust the gain.

INDUSTRIAL APPLICABILITY

The present invention can be applied to technique of adjusting the phase of a sine wave.

REFERENCE SIGNS LIST

1 Clock generation unit
2, 20-1, 20-2 Variable amplifier
3 Adding unit
4 Differential transmission line
5 Terminal circuit
6 Level adjusting unit
30-1, 30-2 Adding unit
40-1, 40-2 Transmission line
400 Dielectric
401, 402 Signal line
403 to 405 Ground plane
Q1 to Q17 Transistor
R1 to R21 Resistor

The invention claimed is:

1. A phase adjustment circuit comprising:
a clock generator configured to generate a sinusoidal clock signal;
a variable amplifier configured to receive the clock signal output from the clock generator as an input, output an amplitude-adjusted sinusoidal differential clock signal, and output an amplitude-adjusted in-phase signal;
an adder configured to output a differential signal obtained by adding the in-phase signal to each of a positive phase side and a negative phase side of the differential clock signal output from the variable amplifier;
a differential transmission line including two transmission lines configured to transmit the differential signal output from the adder; and
a terminal circuit configured to terminate the differential transmission line,
wherein a signal is output from a terminal of any one of the two transmission lines constituting the differential transmission line.

2. The phase adjustment circuit according to claim 1, wherein the terminal circuit includes:
a first resistor, one end of which is connected to a terminal of a first transmission line of the two transmission lines,
a second resistor, one end of which is connected to a terminal of a second transmission line of the two transmission lines, and
a third resistor, one end of which is connected to a connection point of the first and second resistors and the other end is connected to a fixed potential or ground.

3. The phase adjustment circuit according to claim 2, wherein the adder includes
a first transistor including a base or a gate to which a clock signal on the negative phase side of the differential clock signal output from the variable amplifier is input, and a collector or a drain from which a signal on the positive phase side of the differential signal is output;
a second transistor including a base or a gate to which a clock signal on the positive phase side of the differential clock signal output from the variable amplifier is input, and a collector or a drain from which a signal on the negative phase side of the differential signal is output;
a third transistor including a base or a gate to which an in-phase signal output from the variable amplifier is input;
a fourth resistor including one end connected to a power supply voltage;
a fifth resistor including one end connected to the other end of the fourth resistor and the other end connected to the collector or the drain of the first transistor;
a sixth resistor including one end connected to the other end of the fourth resistor and the other end connected to the collector or the drain of the second transistor;
a seventh resistor including one end connected to an emitter or a source of the first transistor and the other end connected to a collector or a drain of the third transistor;

an eighth resistor including one end connected to an emitter or a source of the second transistor and the other end connected to the collector or the drain of the third transistor;

a ninth resistor including one end connected to the power supply voltage and the other end connected to a base or a gate of the third transistor;

a tenth resistor including one end connected to the base or the gate of the third transistor and the other end connected to the ground; and an eleventh resistor including one end connected to an emitter or a source of the third transistor and the other end connected to the ground.

4. The phase adjustment circuit according to claim 2, wherein the variable amplifier includes a first variable amplifier of a Gilbert cell type configured to adjust an amplitude of the differential clock signal and output the differential clock signal, and a second variable amplifier of a Gilbert cell type configured to adjust an amplitude of the in-phase signal and output the in-phase signal.

5. The phase adjustment circuit according to claim 4, wherein the first variable amplifier includes a fourth transistor including a base or a gate to which a first gain control signal is input, and a collector or a drain from which the signal on the positive phase side of the differential clock signal is output;

a fifth transistor including a base or a gate to which a second gain control signal is input, and a collector or a drain from which the signal on the negative phase side of the differential clock signal is output;

a sixth transistor including a base or a gate to which the first gain control signal is input, and a collector or a drain from which the signal on the negative phase side of the differential clock signal is output;

a seventh transistor including a base or a gate to which the second gain control signal is input, and a collector or a drain from which the signal on the positive phase side of the differential clock signal is output;

an eighth transistor including a base or a gate to which the signal on the positive phase side of the differential clock signal output from outside is input, and a collector or a drain connected to an emitter or a source of the fourth transistor and an emitter or a source of the fifth transistor;

a ninth transistor including a base or a gate to which the signal on the negative phase side of the differential clock signal output from outside is input, and a collector or a drain connected to an emitter or a source of the sixth transistor and an emitter or a source of the seventh transistor;

a tenth transistor including a base or a gate to which a bias voltage is applied;

a twelfth resistor including one end connected to the power supply voltage, and the other end connected to a collector or a drain of the fourth transistor and a collector or a drain of the seventh transistor;

a thirteenth resistor including one end connected to the power supply voltage, and the other end connected to a collector or a drain of the fifth transistor and a collector or a drain of the sixth transistor;

a fourteenth resistor including one end connected to an emitter or a source of the eighth transistor and the other end connected to a collector or a drain of the tenth transistor;

a fifteenth resistor including one end connected to an emitter or a source of the ninth transistor, and the other end connected to the collector or the drain of the tenth transistor; and a sixteenth resistor including one end connected to an emitter or a source of the tenth transistor, and the other end connected to the ground, wherein the second variable amplifier includes an eleventh transistor including a base or a gate to which a third gain control signal is input, and a collector or a drain from which an in-phase signal is output;

a twelfth transistor including a base or a gate to which a fourth gain control signal is input;

a thirteenth transistor including a base or a gate to which the third gain control signal is input;

a fourteenth transistor including a base or a gate to which the fourth gain control signal is input, and a collector or a drain from which the in-phase signal is output;

a fifteenth transistor including a base or a gate to which a signal on the positive phase side of the differential clock signal output from outside is input, and a collector or a drain connected to an emitter or a source of the eleventh transistor and an emitter or a source of the twelfth transistor;

a sixteenth transistor including a base or a gate to which a signal on the negative phase side of the differential clock signal output from outside is input, and a collector or a drain connected to an emitter or a source of the thirteenth transistor and an emitter or a source of the fourteenth transistor;

a seventeenth transistor including a base or a gate to which a bias voltage is given;

a seventeenth resistor including one end connected to the power supply voltage, and the other end connected to a collector or a drain of the eleventh transistor and a collector or a drain of the fourteenth transistor;

an eighteenth resistor including one end connected to the power supply voltage, and the other end connected to a collector or a drain of the twelfth transistor and a collector or a drain of the thirteenth transistor;

a nineteenth resistor including one end connected to an emitter or a source of the fifteenth transistor, and the other end connected to a collector or a drain of the seventeenth transistor;

a twentieth resistor including one end connected to an emitter or a source of the sixteenth transistor, and the other end connected to the collector or the drain of the seventeenth transistor; and a twenty-first resistor including one end connected to an emitter or a source of the seventeenth transistor, and the other end connected to the ground.

6. The phase adjustment circuit according to claim 2, wherein the two transmission lines constituting the differential transmission line are disposed so that respective signal lines are adjacent to each other.

7. The phase adjustment circuit according to claim 2, wherein, when a propagation speed for a differential mode of the differential transmission line is defined as vd, a propagation speed for a common mode of the differential transmission line is defined as vc, and a maximum angular frequency of a sinusoidal clock signal to be phase-adjusted is defined as w, a length L of each of the two transmission lines constituting the differential transmission line is set to satisfy $$L < \frac{\pi}{\omega \left| \frac{1}{v_d} - \frac{1}{v_c} \right|}. \qquad \text{[Math. 1]}$$

8. The phase adjustment circuit according to claim 1, wherein the adder includes a first transistor including a base or a gate to which a clock signal on the negative phase side of the differential clock signal output from the variable amplifier is input, and a collector or a drain from which a signal on the positive phase side of the differential signal is output;

a second transistor including a base or a gate to which a clock signal on the positive phase side of the differential clock signal output from the variable amplifier is input, and a collector or a drain from which a signal on the negative phase side of the differential signal is output;

a third transistor including a base or a gate to which an in-phase signal output from the variable amplifier is input;

a fourth resistor including one end connected to a power supply voltage;

a fifth resistor including one end connected to the other end of the fourth resistor and the other end connected to the collector or the drain of the first transistor;

a sixth resistor including one end connected to the other end of the fourth resistor and the other end connected to the collector or the drain of the second transistor;

a seventh resistor including one end connected to an emitter or a source of the first transistor and the other end connected to a collector or a drain of the third transistor;

an eighth resistor including one end connected to an emitter or a source of the second transistor and the other end connected to the collector or the drain of the third transistor;

a ninth resistor including one end connected to the power supply voltage and the other end connected to a base or a gate of the third transistor;

a tenth resistor including one end connected to the base or the gate of the third transistor and the other end connected to ground; and an eleventh resistor including one end connected to an emitter or a source of the third transistor and the other end connected to ground.

9. The phase adjustment circuit according to claim 8, wherein the variable amplifier includes a first variable amplifier of a Gilbert cell type configured to adjust an amplitude of the differential clock signal and outputs the differential clock signal, and a second variable amplifier of a Gilbert cell type configured to adjust an amplitude of the in-phase signal and outputs the in-phase signal.

10. The phase adjustment circuit according to claim 9, wherein the first variable amplifier includes a fourth transistor including a base or a gate to which a first gain control signal is input, and a collector or a drain from which the signal on the positive phase side of the differential clock signal is output;

a fifth transistor including a base or a gate to which a second gain control signal is input, and a collector or a drain from which the signal on the negative phase side of the differential clock signal is output;

a sixth transistor including a base or a gate to which the first gain control signal is input, and a collector or a drain from which the signal on the negative phase side of the differential clock signal is output;

a seventh transistor including a base or a gate to which the second gain control signal is input, and a collector or a drain from which the signal on the positive phase side of the differential clock signal is output;

an eighth transistor including a base or a gate to which the signal on the positive phase side of the differential clock signal output from outside is input, and a collector or a drain connected to an emitter or a source of the fourth transistor and an emitter or a source of the fifth transistor;

a ninth transistor including a base or a gate to which the signal on the negative phase side of the differential clock signal output from outside is input, and a collector or a drain connected to an emitter or a source of the sixth transistor and an emitter or a source of the seventh transistor;

a tenth transistor including a base or a gate to which a bias voltage is applied;

a twelfth resistor including one end connected to the power supply voltage, and the other end connected to a collector or a drain of the fourth transistor and a collector or a drain of the seventh transistor;

a thirteenth resistor including one end connected to the power supply voltage, and the other end connected to a collector or a drain of the fifth transistor and a collector or a drain of the sixth transistor;

a fourteenth resistor including one end connected to an emitter or a source of the eighth transistor, and the other end connected to a collector or a drain of the tenth transistor;

a fifteenth resistor including one end connected to an emitter or a source of the ninth transistor, and the other end connected to the collector or the drain of the tenth transistor; and a sixteenth resistor including one end connected to an emitter or a source of the tenth transistor, and the other end connected to the ground, wherein the second variable amplifier includes an eleventh transistor including a base or a gate to which a third gain control signal is input, and a collector or a drain from which an in-phase signal is output;

a twelfth transistor including a base or a gate to which a fourth gain control signal is input;

a thirteenth transistor including a base or a gate to which the third gain control signal is input;

a fourteenth transistor including a base or a gate to which the fourth gain control signal is input, and a collector or a drain from which the in-phase signal is output;

a fifteenth transistor including a base or a gate to which a signal on the positive phase side of the differential clock signal output from outside is input, and a collector or a drain connected to an emitter or a source of the eleventh transistor and an emitter or a source of the twelfth transistor;

a sixteenth transistor including a base or a gate to which a signal on the negative phase side of the differential clock signal output from outside is input, and a collector or a drain connected to an emitter or a source of the thirteenth transistor and an emitter or a source of the fourteenth transistor;

a seventeenth transistor including a base or a gate to which a bias voltage is given;

a seventeenth resistor including one end connected to the power supply voltage, and the other end connected to a collector or a drain of the eleventh transistor and a collector or a drain of the fourteenth transistor;

an eighteenth resistor including one end connected to the power supply voltage, and the other end connected to a collector or a drain of the twelfth transistor and a collector or a drain of the thirteenth transistor;

a nineteenth resistor including one end connected to an emitter or a source of the fifteenth transistor, and the other end connected to a collector or a drain of the seventeenth transistor;

a twentieth resistor including one end connected to an emitter or a source of the sixteenth transistor, and the other end connected to the collector or the drain of the seventeenth transistor; and a twenty-first resistor including one end connected to an emitter or a source of the seventeenth transistor, and the other end connected to the ground.

11. The phase adjustment circuit according to claim 8, wherein the two transmission lines constituting the differential transmission line are disposed so that respective signal lines are adjacent to each other.

12. The phase adjustment circuit according to claim 8, wherein, when a propagation speed for a differential mode of the differential transmission line is defined as vd, a propagation speed for a common mode of the differential transmission line is defined as vc, and a maximum angular frequency of a sinusoidal clock signal to be phase-adjusted is defined as w, a length L of each of the two transmission lines constituting the differential transmission line is set to satisfy $$L < \frac{\pi}{\omega \left| \frac{1}{v_d} - \frac{1}{v_c} \right|}.$$ [Math. 1]

13. The phase adjustment circuit according to claim 8, further comprising:

a level adjusting unit configured to perform an amplitude adjustment of a signal output from a terminal of one of the two transmission lines constituting the differential transmission line.

14. The phase adjustment circuit according to claim 1, wherein the variable amplifier includes a first variable amplifier of a Gilbert cell type configured to adjust an amplitude of the differential clock signal and output the differential clock signal, and a second variable amplifier of a Gilbert cell type configured to adjust an amplitude of the in-phase signal and output the in-phase signal.

15. The phase adjustment circuit according to claim 14, wherein the first variable amplifier includes a fourth transistor including a base or a gate to which a first gain control signal is input, and a collector or a drain from which the signal on the positive phase side of the differential clock signal is output;

a fifth transistor including a base or a gate to which a second gain control signal is input, and a collector or a drain from which the signal on the negative phase side of the differential clock signal is output;

a sixth transistor including a base or a gate to which the first gain control signal is input, and a collector or a drain from which the signal on the negative phase side of the differential clock signal is output;

a seventh transistor including a base or a gate to which the second gain control signal is input, and a collector or a drain from which the signal on the positive phase side of the differential clock signal is output;

an eighth transistor including a base or a gate to which the signal on the positive phase side of the differential clock signal output from outside is input, and a collector or a drain connected to an emitter or a source of the fourth transistor and an emitter or a source of the fifth transistor;

a ninth transistor including a base or a gate to which the signal on the negative phase side of the differential clock signal output from outside is input, and a collector or a drain connected to an emitter or a source of the sixth transistor and an emitter or a source of the seventh transistor;

a tenth transistor including a base or a gate to which a bias voltage is applied;

a twelfth resistor including one end connected to the power supply voltage, and the other end connected to a collector or a drain of the fourth transistor and a collector or a drain of the seventh transistor;

a thirteenth resistor including one end connected to the power supply voltage, and the other end connected to a collector or a drain of the fifth transistor and a collector or a drain of the sixth transistor;

a fourteenth resistor including one end connected to an emitter or a source of the eighth transistor, and the other end connected to a collector or a drain of the tenth transistor;

a fifteenth resistor including one end connected to an emitter or a source of the ninth transistor, and the other end connected to the collector or the drain of the tenth transistor; and a sixteenth resistor including one end connected to an emitter or a source of the tenth transistor, and the other end connected to ground, wherein the second variable amplifier includes an eleventh transistor including a base or a gate to which a third gain control signal is input, and a collector or a drain from which an in-phase signal is output;

a twelfth transistor including a base or a gate to which a fourth gain control signal is input;

a thirteenth transistor including a base or a gate to which the third gain control signal is input;

a fourteenth transistor including a base or a gate to which the fourth gain control signal is input, and a collector or a drain from which the in-phase signal is output;

a fifteenth transistor including a base or a gate to which a signal on the positive phase side of the differential clock signal output from outside is input, and a collector or a drain connected to an emitter or a source of the eleventh transistor and an emitter or a source of the twelfth transistor;

a sixteenth transistor including a base or a gate to which a signal on the negative phase side of the differential clock signal output from outside is input, and a collector or a drain connected to an emitter or a source of the thirteenth transistor and an emitter or a source of the fourteenth transistor;

a seventeenth transistor including a base or a gate to which a bias voltage is given;

a seventeenth resistor including one end connected to the power supply voltage, and the other end connected to a collector or a drain of the eleventh transistor and a collector or a drain of the fourteenth transistor;

an eighteenth resistor including one end connected to the power supply voltage, and the other end connected to a collector or a drain of the twelfth transistor and a collector or a drain of the thirteenth transistor;
a nineteenth resistor including one end connected to an emitter or a source of the fifteenth transistor, and the other end connected to a collector or a drain of the seventeenth transistor;
a twentieth resistor including one end connected to an emitter or a source of the sixteenth transistor, and the other end connected to the collector or the drain of the seventeenth transistor; and
a twenty-first resistor including one end connected to an emitter or a source of the seventeenth transistor, and the other end connected to ground.

16. The phase adjustment circuit according to claim 1, wherein the two transmission lines constituting the differential transmission line are disposed so that respective signal lines are adjacent to each other.

17. The phase adjustment circuit according to claim 1, wherein, when a propagation speed for a differential mode of the differential transmission line is defined as vd, a propagation speed for a common mode of the differential transmission line is defined as vc, and a maximum angular frequency of a sinusoidal clock signal to be phase-adjusted is defined as w, a length L of each of the two transmission lines constituting the differential transmission line is set to satisfy $$L < \frac{\pi}{\omega \left| \frac{1}{v_d} - \frac{1}{v_c} \right|}.$$ [Math. 1]

18. The phase adjustment circuit according to claim 1, further comprising:
a level adjusting unit configured to perform an amplitude adjustment of a signal output from a terminal of one of the two transmission lines constituting the differential transmission line.

19. A phase adjustment circuit comprising:
a clock generation unit configured to generate a sinusoidal differential clock signal;
a first variable amplifier configured to receive the differential clock signal, adjust an amplitude of the differential clock signal based on a first gain control signal, and output an amplitude-adjusted differential clock signal;
a second variable amplifier configured to receive the differential clock signal, adjust an amplitude of the differential clock signal based on a second gain control signal to generate an amplitude-adjusted in-phase signal, and output the amplitude-adjusted in-phase signal;
an adding unit including:
   a first adding circuit configured to add a positive phase side of the amplitude-adjusted differential clock signal and the amplitude-adjusted in-phase signal to generate a first sum signal, and
   a second adding circuit configured to add a negative phase side of the amplitude-adjusted differential clock signal and the amplitude-adjusted in-phase signal to generate a second sum signal;
a differential transmission line including a first transmission line configured to receive the first sum signal and a second transmission line configured to receive the second sum signal, the first and second transmission lines being electromagnetically coupled to each other and having different propagation speeds for differential mode and common mode signals; and
a terminal circuit connected to a first end of the first transmission line and a first end of the second transmission line;
wherein a phase-adjusted sinusoidal signal is output from the first end of the first transmission line or the first end of the second transmission line.

20. The phase adjustment circuit according to claim 19, wherein the terminal circuit includes:
a first resistor having a first end connected to the first end of the first transmission line;
a second resistor having a first end connected to the first end of the second transmission line; and
a third resistor (R3) having a first end connected to a second end of the first resistor and a second end of the second resistor, and a second end connected to a fixed potential or ground.

* * * * *